(12) United States Patent
Yamaguchi et al.

(10) Patent No.: US 9,013,093 B2
(45) Date of Patent: Apr. 21, 2015

(54) VIBRATING REED, ELECTRONIC DEVICE, AND ELECTRONIC APPARATUS

(71) Applicant: Seiko Epson Corporation, Tokyo (JP)

(72) Inventors: Keiichi Yamaguchi, Ina (JP); Seiji Osawa, Minowa (JP); Seiichiro Ogura, Minowa (JP); Takayuki Kikuchi, Okaya (JP)

(73) Assignee: Seiko Epson Corporation (JP)

( * ) Notice: Subject to any disclaimer, the term of this patent is extended or adjusted under 35 U.S.C. 154(b) by 146 days.

(21) Appl. No.: 13/905,581

(22) Filed: May 30, 2013

(65) Prior Publication Data

US 2013/0320812 A1    Dec. 5, 2013

(30) Foreign Application Priority Data

Jun. 4, 2012   (JP) ................................. 2012-126757

(51) Int. Cl.
*H01L 41/053*   (2006.01)
*G01C 19/5607*   (2012.01)

(52) U.S. Cl.
CPC .......... *H01L 41/053* (2013.01); *G01C 19/5607* (2013.01)

(58) Field of Classification Search
USPC .............. 310/370, 348, 311, 367; 73/504.12, 73/504.15, 504.16, 504.14
See application file for complete search history.

(56) References Cited

U.S. PATENT DOCUMENTS

| | | | |
|---|---|---|---|
| 5,476,008 A * | 12/1995 | Pinson | 310/367 |
| 5,998,911 A | 12/1999 | Kikuchi et al. | |
| 6,439,051 B2 * | 8/2002 | Kikuchi et al. | 73/504.12 |
| 7,210,350 B2 | 5/2007 | Ogura | |
| 7,412,885 B2 * | 8/2008 | Ogura | 310/370 |
| 2006/0162447 A1 | 7/2006 | Ogura | |

FOREIGN PATENT DOCUMENTS

| | | |
|---|---|---|
| JP | 10-160478 | 6/1998 |
| JP | 2006-201011 A | 8/2006 |
| JP | 2006-201053 A | 8/2006 |
| JP | 2010-025945 A | 2/2010 |
| JP | 2010-256332 A | 11/2010 |
| JP | 2011-017581 A | 1/2011 |

* cited by examiner

*Primary Examiner* — Thomas Dougherty
*Assistant Examiner* — Karen B Addison
(74) *Attorney, Agent, or Firm* — Harness, Dickey & Pierce, P.L.C.

(57) ABSTRACT

A vibrating reed includes a vibrating body (a base portion, a vibrating arm, and a detection arm) and a support portion that supports the vibrating body via a plate-like coupling portion. In both principal surfaces of the coupling portion, grooves (a first groove and a second groove) are disposed. The first groove arranged in one of the principal surfaces of the coupling portion and the second groove arranged in the other principal surface are arranged at positions different from each other in plan view.

15 Claims, 10 Drawing Sheets

US 9,013,093 B2

VIBRATING REED, ELECTRONIC DEVICE, AND ELECTRONIC APPARATUS

BACKGROUND

1. Technical Field

The present invention relates to a vibrating reed, and particularly, to a vibrating reed with reduced vibration leakage, and an electronic device and an electronic apparatus both using the vibrating reed.

2. Related Art

Heretofore, as an angular velocity sensor for detecting a rotational angular velocity of a rotating system, a vibration-type gyro sensor using a piezoelectric vibrating reed or a vibrator having a piezoelectric vibrating reed accommodated in a container has been used. The vibration-type gyro sensor is used for a car navigation system, camera shake detection of a still camera, and the like.

For the piezoelectric vibrating reed used for the vibration-type piezoelectric gyro sensor, a piezoelectric vibrating reed configured of a plurality of vibrating arms extended in the same plane and a base portion coupling the vibrating arms together is used. The vibration-type piezoelectric gyro sensor drives and vibrates the piezoelectric vibrating reed with a drive circuit, detects a detection vibration generated according to a rotational angular velocity with a detection circuit, and outputs an electric signal. A driving vibration is generated in the whole or a portion of the plurality of vibrating arms. When a rotational angular velocity is applied to the piezoelectric vibrating reed, a Coriolis force in a direction orthogonal to a driving vibration direction acts on the vibrating arm that is driven and vibrated, and a detection vibration according to the rotational angular velocity is generated in the whole or a portion of the plurality of vibrating arms.

When axes perpendicular to each other are defined as an X-axis and a Y-axis, a related-art piezoelectric vibrating reed has a pair of coupling arms extended from a base portion in opposite directions along the X-axis, a pair of detection arms extended from the base portion in opposite directions along the Y-axis, and a pair of vibrating arms extended from each of the coupling arms in opposite directions along the Y-axis. The piezoelectric vibrating reed adopts a structure in which the base portion and a support portion are coupled with a coupling portion (refer to JP-A-2010-256332).

In the piezoelectric vibrating reed, since the vibrating arm vibrates when the piezoelectric vibrating reed is driven, the vibration sometimes leaks to the support portion via the coupling portion. Therefore, in JP-A-2010-256332, the coupling portion is made into an S-shape, so that a path on the coupling portion from the base portion to the support portion is bent and lengthened. Due to this, the amount of damping of vibration generated in the vibrating arm and leaking in the coupling portion via the base portion is increased in the coupling portion, so that the amount of vibration leaking to the support portion is reduced.

However, due to a reduction in the size of the piezoelectric vibrating reed, the size of the coupling portion is also reduced, and therefore, the path on the coupling portion from the base portion to the support portion is shortened. Therefore, the amount of damping of vibration in the coupling portion is reduced, so that the amount of vibration leaking to the support portion is increased. Due to this, the excitation efficiency of the vibrating arm or a temperature characteristic of a resonant frequency is deteriorated.

SUMMARY

An advantage of some aspects of the invention is to provide a vibrating reed that can reduce vibration leakage even when the size thereof is reduced, and an electronic device and an electronic apparatus both using the vibrating reed.

The invention can be implemented as the following application examples.

Application Example 1

This application example is directed to a vibrating reed including: a vibrating body; and a support portion that supports the vibrating body via a plate-like coupling portion, wherein a groove is disposed in both principal surfaces of the coupling portion, and the groove arranged in one of the principal surfaces of the coupling portion and the groove arranged in the other principal surface are arranged at positions different from each other in plan view.

With the above configuration, the coupling portion has a shape bent also in a thickness direction. Due to this, a vibration propagation path in the coupling portion also bends in the thickness direction of the coupling portion, conforming to the shape of the coupling portion in the thickness direction. Therefore, without enlarging the coupling portion, the vibration propagation path on the coupling portion from the vibrating body to the support portion can be lengthened. Hence, the amount of damping of vibration from the vibrating body can be further increased, even when the vibrating reed is reduced in size, to reduce vibration leakage to the support portion.

Application Example 2

This application example is directed to the vibrating reed according to Application Example 1, wherein the sum of the depth of the groove arranged in the one principal surface of the coupling portion and the depth of the groove arranged in the other principal surface has a value greater than that of the thickness of the coupling portion.

With the above configuration, a vibration from the vibrating body toward the support portion has only a component that propagates through the coupling portion while being bent in the thickness direction of the coupling portion due to the grooves. Therefore, the vibration leakage to the support portion can be further reduced.

Application Example 3

This application example is directed to the vibrating reed according to Application Example 1 or 2, wherein the coupling portion bends in a direction perpendicular to a thickness direction of the coupling portion.

With the above configuration, since the coupling portion is made into a shape bent in its plane direction, the vibration propagation path in the coupling portion also bends in the plane direction. Hence, the vibration propagation path on the coupling portion from the vibrating body to the support portion can be further lengthened.

Application Example 4

This application example is directed to the vibrating reed according to any one of Application Example 1 to Application Example 3, wherein a plurality of the grooves are arranged side by side along a vibration propagation path on the coupling portion from the vibrating body to the support portion.

With the above configuration, since the vibration from the vibrating body toward the support portion propagates through the coupling portion while repeating the bending in the thickness direction of the coupling portion, the vibration leakage to the support portion can be effectively reduced.

Application Example 5

This application example is directed to the vibrating reed according to any one of Application Example 1 to Application Example 4, wherein when directions perpendicular to each other are defined as a first direction and a second direction, the vibrating body has a base portion connected to the coupling portion, a pair of coupling arms extending from the base portion in opposite directions in the first direction, a pair of vibrating arms extending from a tip of each of the coupling arms in opposite directions in the second direction, and a pair of detection arms extending from the base portion in opposite directions in the second direction.

With the above configuration, a vibrating reed of a so-called WT-type that can reduce the vibration leakage to the support portion is provided.

Application Example 6

This application example is directed to an electronic device including the vibrating reed according to any one of Application Example 1 to Application Example 5 mounted thereon.

With the above configuration, an electronic device with reduced vibration leakage is provided.

Application Example 7

This application example is directed to an electronic apparatus including the vibrating reed according to any one of Application Example 1 to Application Example 5 mounted thereon.

With the above configuration, an electronic apparatus with reduced vibration leakage is provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
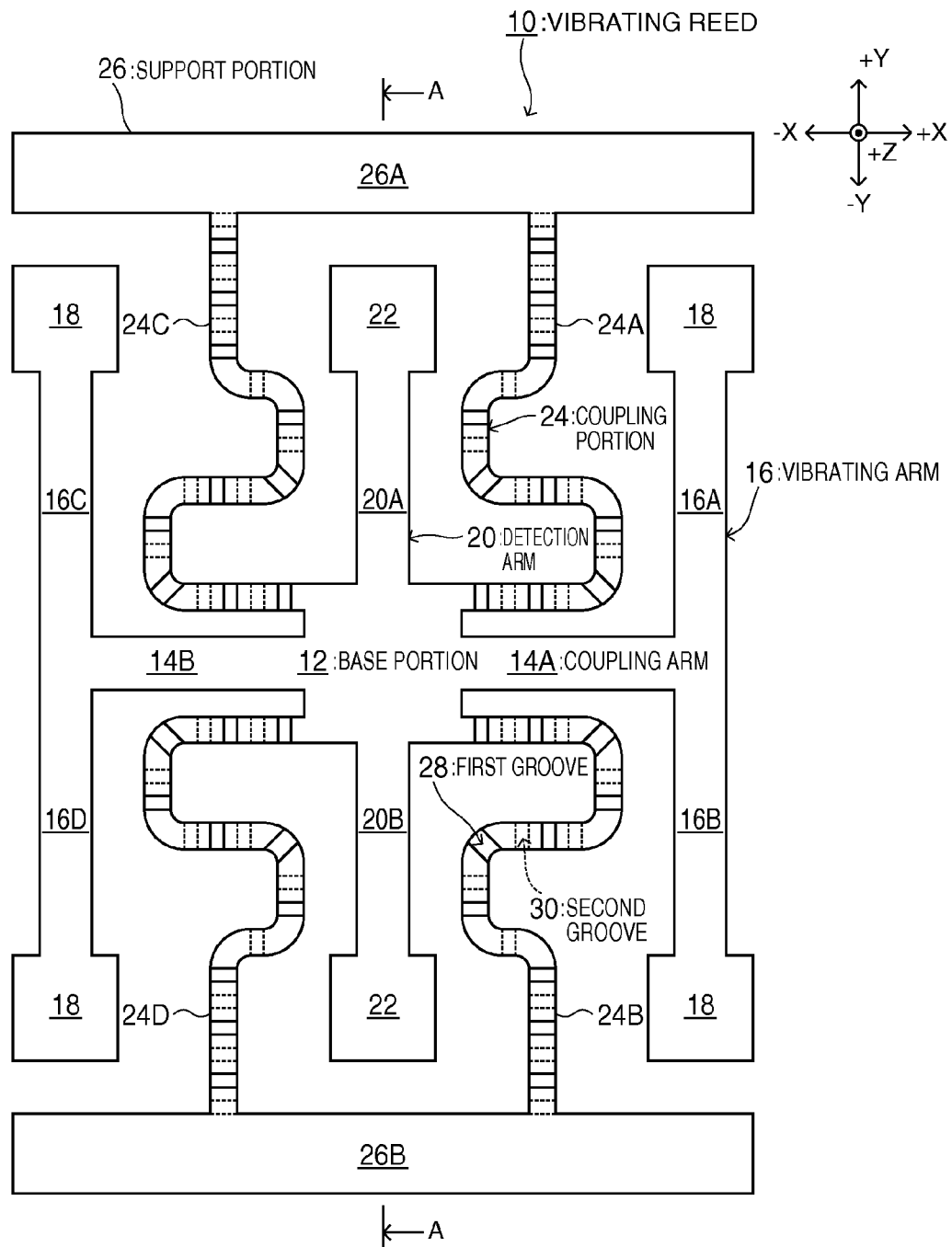
FIG. 1 is a plan view of a vibrating reed of an embodiment.

Hereinafter, the invention will be described in detail using an embodiment shown in the drawings. However, constituent elements, kinds, combinations, shapes, relative arrangements thereof, and the like described in this embodiment are not intended to limit the scope of the invention but are merely explanatory examples unless a specific description is provided. In the drawings and the following description, an X-axis (first direction), a Y-axis (second direction), and a Z-axis are perpendicular to one another.

FIG. 1 shows a plan view of a vibrating reed of the embodiment. The vibrating reed of the embodiment is formed of a piezoelectric material such as quartz crystal. As shown in FIG. 1, the vibrating reed is a gyro sensor of a so-called WT-type. The vibrating reed 10 is configured of a vibrating body (a base portion 12, a vibrating arm 16 (16A to 16D), a detection arm 20 (20A and 20B), and the like), a support portion 26 (26A and 26B), and a coupling portion 24.

Although details will be described later, grooves (first grooves 28 and second grooves 30) extending in a direction in which the coupling portion 24 is separated into a portion connected to the vibrating body and a portion connected to the support portion 26 are arranged in both principal surfaces (surfaces facing the Z-axis) of the coupling portion 24 in the vibrating reed 10 of the embodiment. The first groove 28 arranged in one of the principal surfaces of the coupling portion 24 and the second groove 30 arranged in the other principal surface are arranged at positions different from each other in plan view (viewed from the Z-axis direction).

With the above configuration, the coupling portion 24 has a shape bent also in its thickness direction. Due to this, also a vibration propagation path in the coupling portion 24 bends in the thickness direction of the coupling portion 24, conforming to the shape of the coupling portion 24 in the thickness direction. Therefore, without enlarging the coupling portion 24, the vibration propagation path on the coupling portion 24 from the vibrating body to the support portion 26 can be further lengthened. Hence, the amount of damping of vibration from the vibrating body can be further increased, even when the vibrating reed 10 is reduced in size, to reduce vibration leakage to the support portion 26. Hereinafter, the embodiment will be described in detail.

At a central portion of the vibrating reed 10 of the embodiment, the base portion 12 having a rectangular shape is arranged. A coupling arm 14A extends in the positive X-axis direction from an edge side of the base portion 12 on the positive X-axis side. A coupling arm 14B extends in the negative X-axis direction from an edge side of the base portion 12 on the negative X-axis side. The vibrating arm 16A extends in the positive Y-axis direction from an edge side of a tip of the coupling arm 14A on the positive Y-axis side. The vibrating arm 16B extends in the negative Y-axis direction from an edge side of the tip of the coupling arm 14A on the negative Y-axis side. Similarly, the vibrating arm 16C extends in the positive Y-axis direction from an edge side of a tip of the coupling arm 14B on the positive Y-axis side. The vibrating arm 16D extends in the negative Y-axis direction from an edge side of the tip of the coupling arm 14B on the negative Y-axis side.

Moreover, the detection arm 20A extends in the positive Y-axis direction from an edge side of the base portion 12 on the positive Y-axis side. The detection arm 20B extends in the negative Y-axis direction from an edge side of the base portion 12 on the negative Y-axis side. Then, tip portions 18 of the vibrating arms 16A to 16D are formed to be wider than the other portions of the vibrating arms 16A to 16D. Similarly, tip portions 22 of the detection arms 20A and 20B are formed to be wider than the other portions of the detection arms 20A and 20B.

On the other hand, the coupling portion 24A extends from a portion of the edge side of the base portion 12 on the positive X-axis side, where the portion is on the positive Y-axis side. The coupling portion 24B extends from a portion of the edge side of the base portion 12 on the positive X-axis side, where the portion is on the negative Y-axis side. Similarly, the coupling portion 24C extends from a portion of the edge side of the base portion 12 on the negative X-axis side, where the portion is on the positive Y-axis side. The coupling portion 24D extends from a portion of the edge side of the base portion 12 on the positive X-axis side, where the portion is on the negative Y-axis side. Moreover, the support portion 26A is arranged at a position on the positive Y-axis side of the tip portions 18 of the vibrating arms 16A and 16C and the tip portion 22 of the detection arm 20A. The support portion 26B is arranged at a position on the negative Y-axis side of the tip portions 18 of the vibrating arms 16B and 16D and the tip portion 22 of the detection arm 20B.

The coupling portion 24 (24A to 24D) has a plate shape bent like an S-shape (may be another shape) in an XY-plane (a direction perpendicular to the thickness direction of the coupling portion 24) as shown in FIG. 1, and is a member that is deformed by being subjected to force. The coupling portions 24A to 24D are arranged so as not to interfere with the vibrating arms 16A to 16D and the detection arms 20A and 20B, all of which vibrate. The coupling portions 24A and 24C are connected to the support portion 26A, while the coupling portions 24B and 24D are connected to the support portion 26B. Since the coupling portion 24 has a shape bent like an S-shape, the vibration propagation path from the base portion 12 through the coupling portion 24 to the support portion 26 has also a shape bent like an S-shape, conforming to the shape of the coupling portion 24. Hence, the vibration propagation path in the coupling portion 24 can be lengthened, so that the amount of damping of vibration in the coupling portion 24 can be increased.

In the vibrating reed 10 of the embodiment, the base portion 12, the coupling arms 14A and 14B, the vibrating arm 16, the detection arm 20, the coupling portion 24, and the support portion 26 each have principal surfaces (surfaces with the Z-axis as a normal line) each on which they are flush with each other on the XY-plane. Therefore, the vibrating reed 10 can be formed by etching a plate-like member (quartz crystal substrate) that encompasses the external shape of the vibrating reed 10, conforming to the external shape of the vibrating reed 10.

Excitation electrodes (not shown) are arranged on both of the principal surfaces of the vibrating arm 16 facing the Z-axis side and on both side surfaces thereof facing the X-axis side. Extraction electrodes (not shown) connected to the excitation electrodes (not shown in FIG. 1) are arranged on the coupling arms 14A and 14B, and extend to the base portion 12. Detection electrodes (not shown) are arranged on both of the principal surfaces of the detection arms 20A and 20B, and extraction electrodes (not shown) connected to the detection electrodes (not shown) are arranged on the base portion 12. These extraction electrodes (not shown) extend to the coupling portion 24 and the support portion 26, and are connected to connection electrodes (not shown) arranged on the support portion 26. Moreover, adjustment electrodes (not shown in FIG. 1) for adjusting a resonant frequency of the vibrating arm 16 and the detection arm 20 are arranged on both of the principal surfaces (may be one surface) of the tip portions 18 and 22. In the vibrating reed 10 of the embodiment, the support portion is bonded to a package, and the base portion 12, the coupling arms 14A and 14B, the vibrating arm 16, and the detection arm 20 are in a state of being suspended by the coupling portion 24 (refer to FIG. 10).

In the above configuration, by applying an AC voltage to the connection electrodes (not shown) electrically connected to the excitation electrodes (not shown), the vibrating arm 16 vibrates at a predetermined resonant frequency as described later. Moreover, when an angular velocity about the Z-axis is applied to the vibrating reed 10, a detection signal caused by a Coriolis force can be taken out, as described later, from the connection electrodes (not shown) electrically connected to the detection electrodes (not shown).

Figure 2:
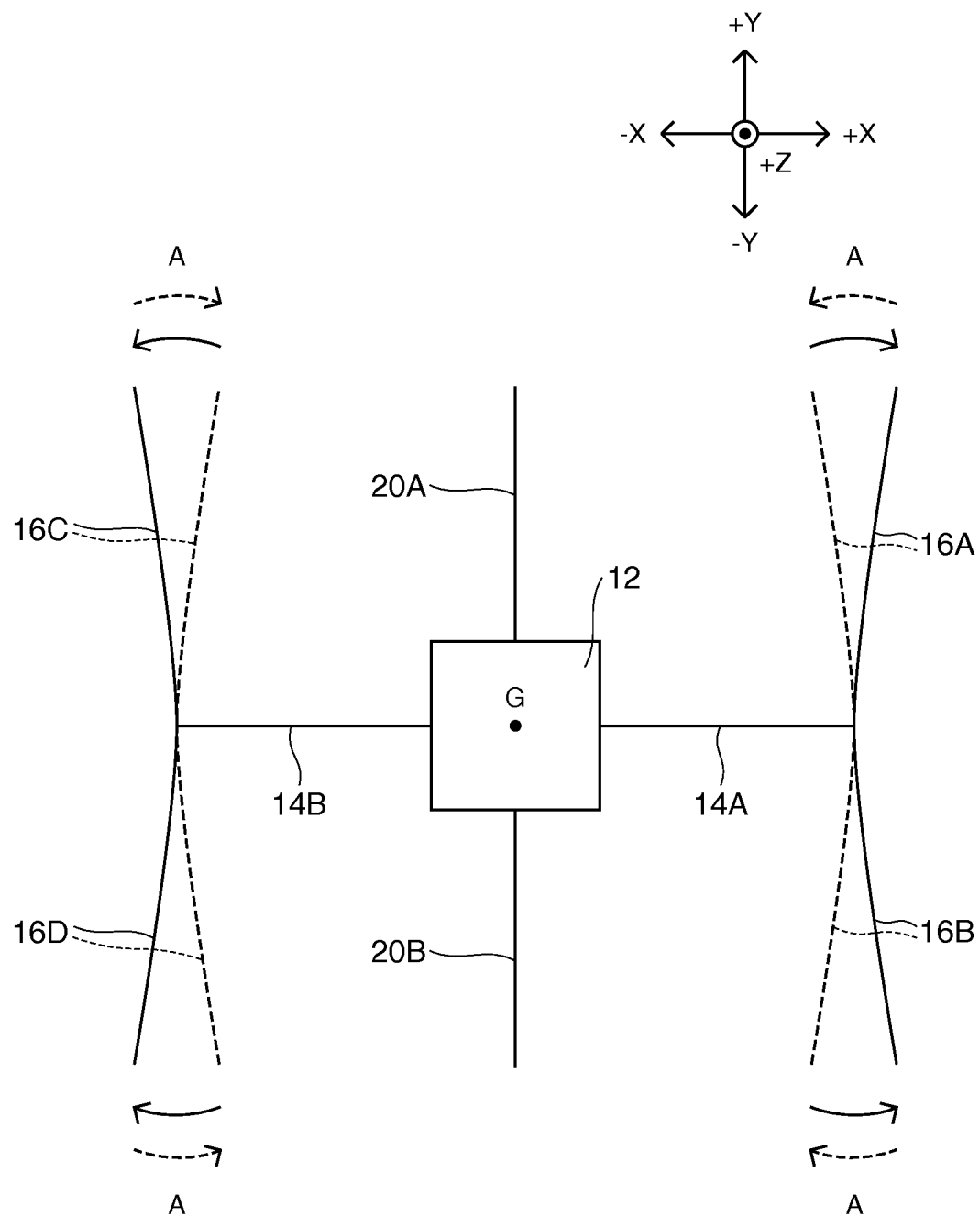
FIG. 2 shows operation (without an angular velocity) of the vibrating reed of the embodiment.
Figure 3:
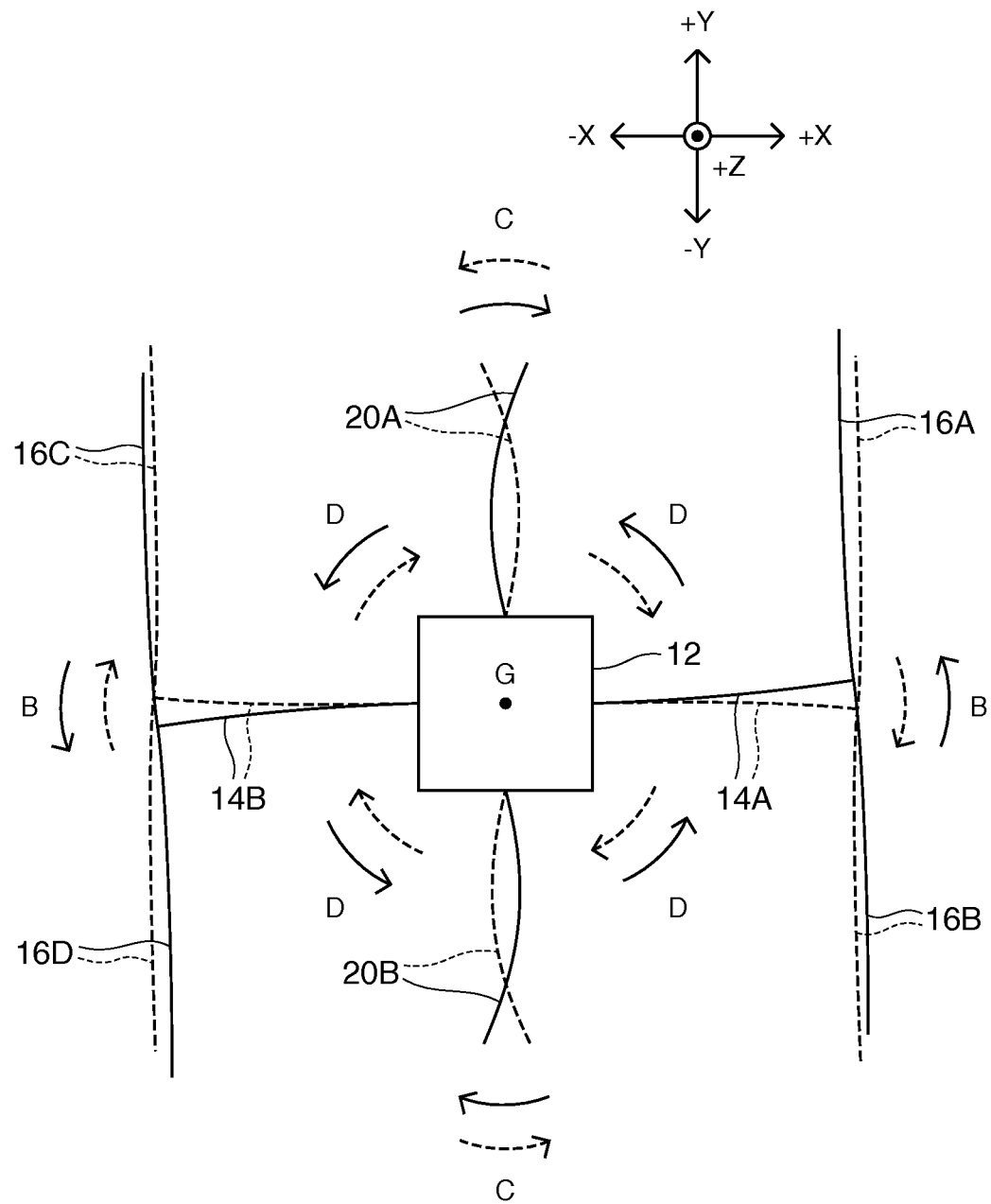
FIG. 3 shows operation (with an angular velocity) of the vibrating reed of the embodiment.

FIG. 2 shows operation (without an angular velocity) of the vibrating reed of the embodiment. FIG. 3 shows operation (with an angular velocity) of the vibrating reed of the embodiment. As shown in FIG. 2, in a state where an angular velocity is not applied, the vibrating arms 16A to 16D perform a bending vibration in a direction indicated by an arrow A in the drawing. This bending vibration repeats a vibration form indicated by solid lines and a vibration form indicated by broken lines at a predetermined resonant frequency. In this case, since a vibrating system formed of the vibrating arms 16A and 16B and a vibrating system formed of the vibrating arms 16C and 16D perform vibrations that are line-symmetrical with respect to the Y-axis passing through a center of gravity G, the base portion 12 and the detection arms 20A and 20B hardly vibrate.

When in a state of performing this vibration, an angular velocity about the Z-axis is applied to the vibrating reed 10, the vibrating reed 10 vibrates as shown in FIG. 3. That is, a Coriolis force in an arrow B direction acts on the vibrating arms 16A to 16D. Due to this, the coupling arm 14A receives force in the arrow B direction from the vibrating arms 16A and 16B, and the coupling arm 14B receives force in the arrow B direction from the vibrating arms 16C and 16D, so that a new vibration is excited. This vibration in the arrow B direction is a vibration in a circumferential direction about the center of gravity G. In conjunction with this vibration in the circumferential direction, a detection vibration in an arrow C direction is excited in the detection arms 20A and 20B. Then, a voltage generated by strain of a piezoelectric material of the detection arms 20A and 20B, where the strain is generated by the detection vibration, is detected via the detection electrodes (not shown) arranged on the detection arms 20A and 20B, whereby the angular velocity is obtained.

In this case, a peripheral portion of the base portion 12 vibrates in the circumferential direction about the center of gravity G in an arrow D direction. This is because the detection vibration is a balance vibration including the base portion 12, in addition to a balance vibration of a vibrating system formed of the vibrating arms 16A to 16D and the coupling arms 14A and 14B, and the detection arms 20A and 20B. The vibration amplitude of the peripheral portion of the base portion 12 indicated by this arrow D is very small compared to the vibration amplitude of the vibrating system formed of the vibrating arms 16A to 16D and the coupling arms 14A and 14B indicated by the arrow B or the vibration amplitude of the detection arms 20A and 20B indicated by the arrow C. However, for example, when the base portion 12 is adhesively fixed, the vibration of the peripheral portion of the base portion 12 is suppressed by this fixation, and the detection vibration is also suppressed. Because of this, the supporting of the base portion 12 reduces the detection sensitivity of angular velocity.

However, in the embodiment, the base portion 12 is supported by the coupling portion 24 that is deformed by being subjected to force. Therefore, with the deformation of the coupling portion 24 being subjected to force, the suppression of the vibration of the peripheral portion of the base portion 12 in the arrow D direction is reduced, so that the reduction in the detection sensitivity of angular velocity can be suppressed.

Figure 4:
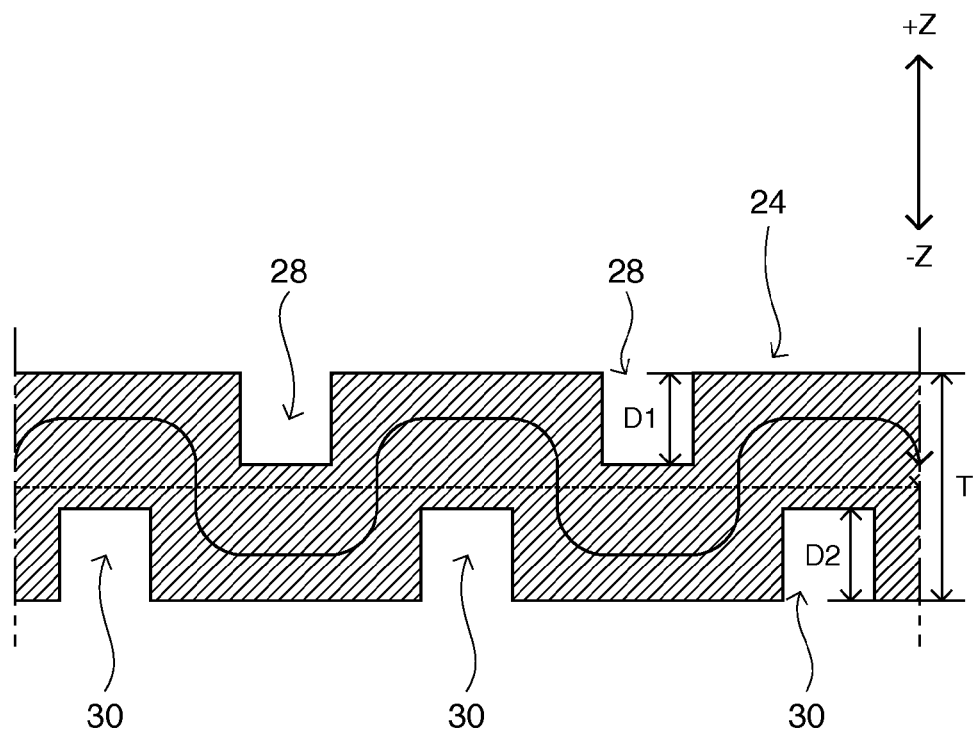
FIG. 4 is a cross-sectional view (Part 1) of a coupling portion constituting the vibrating reed of the embodiment.
Figure 5:
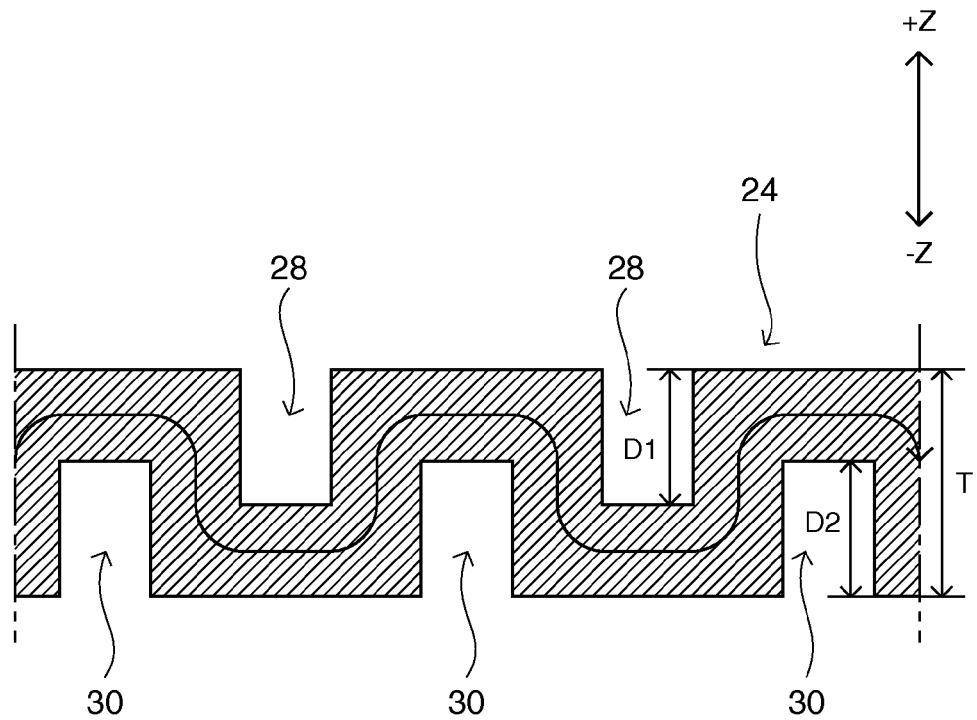
FIG. 5 is a cross-sectional view (Part 2) of a coupling portion constituting the vibrating reed of the embodiment.
Figure 6:
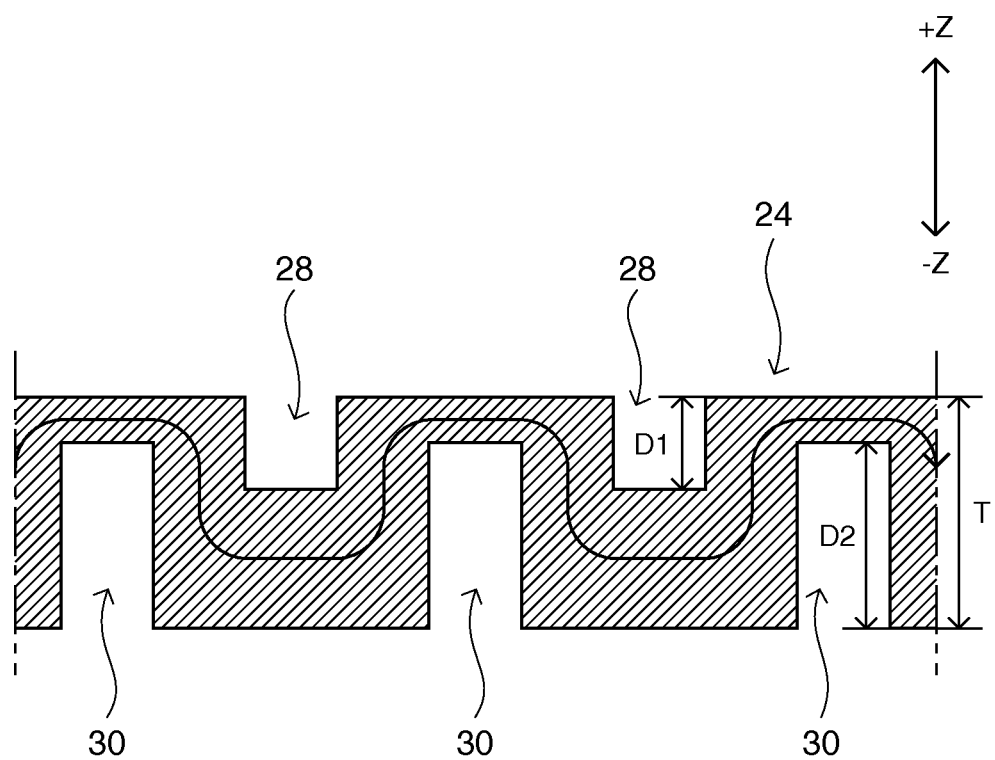
FIG. 6 is a cross-sectional view (Part 3) of a coupling portion constituting the vibrating reed of the embodiment.

FIGS. 4 to 6 show cross-sectional views of coupling portions constituting the vibrating reed of the embodiment. As shown in FIGS. 4 to 6, the first grooves 28 are formed in the surface of the coupling portion 24 on the positive Z-axis side, while the second grooves 30 are formed in the surface on the negative Z-axis side. The coupling portion 24 couples the base portion 12 with the support portion 26. Therefore, a vibration generated in the vibrating arm 16 propagates through the coupling portion 24 by way of the coupling arms 14A and 14B and the base portion 12 to reach the support portion 26.

The first grooves 28 and the second grooves 30 arranged in the coupling portion 24 extend in the direction in which the coupling portion 24 is divided so as to separate the coupling between the base portion 12 and the support portion 26 through the coupling portion 24, and are arranged so as to reach both side surfaces of the coupling portion 24 (refer to FIG. 1). Moreover, the first groove 28 and the second groove 30 are arranged at positions different from each other in plan view (viewed from the Z-axis direction). Due to this, the coupling portion 24 has a shape bent in the thickness direction (the Z-axis direction), so that the vibration propagation path on the coupling portion 24 has also the shape bent in the thickness direction conforming to the bending shape of the coupling portion 24 in the thickness direction. Due to this, without enlarging the coupling portion 24 in the XY-plane direction, the vibration propagation path in the coupling portion 24 can be lengthened. Therefore, a vibration leaked out from the base portion 12 can be effectively damped on the propagation path of the coupling portion 24.

Moreover, a plurality of the first grooves 28 and a plurality of the second grooves 30 are arranged at predetermined intervals along the vibration propagation path in the XY-plane on the coupling portion 24 from the base portion 12 to the support portion 26. Due to this, since the vibration propagation path on the coupling portion 24 repeats the shape bent in the thickness direction of the coupling portion 24, the propagation path is further lengthened, so that the vibration can be further effectively damped.

By the way, in FIG. 4, both of the first groove 28 and the second groove 30 have depths smaller than half the size of the thickness of the coupling portion 24. Therefore, as indicated by a broken line in FIG. 4, the propagation path has, in the vibration propagating through the coupling portion 24, a component (the broken-line arrow in FIG. 4) that does not change in the thickness direction of the coupling portion 24 in addition to a component (a solid-line arrow in FIG. 4) that changes in the thickness direction conforming to the bending shape of the coupling portion 24 in the thickness direction, so that it is conceivable that vibration damping by the coupling portion 24 is insufficient. Therefore, as shown in FIGS. 5 and 6, the vibration propagation path is desirably configured to block the component that does not change in the thickness direction of the coupling portion 24 to have only the component (solid-line arrows in FIGS. 5 and 6) that changes in the thickness direction of the coupling portion 24.

In this case, when the depth of the first groove 28 is D1, the depth of the second groove 30 is D2, and the thickness of the coupling portion 24 in the Z-axis direction is T, the values of D1 and D2 may be determined so as to satisfy a relation of $T<(D1+D2)$. For example, $D1=D2>(T/2)$ is satisfied in FIG. 5, while $D1<(T/2)<D2$ and $T<(D1+D2)$ are satisfied in FIG. 6.

With the above configuration, since the vibration from the base portion 12 toward the support portion 26 has only the component that propagates through the coupling portion 24 while being bent in the thickness direction of the coupling portion 24 due to the first grooves 28 and the second grooves 30, vibration leakage to the support portion 26 can be further reduced. Even in any of the cases, the first groove 28 and the second groove 30 can be formed by half-etching.

FIGS. 7A to 9D show manufacturing steps (Part 1, Part 2, and Part 3) of an electrode formed on the vibrating reed of the embodiment. As described above, the excitation electrodes, the detection electrodes, the extraction electrodes, the connection electrodes, and the adjustment electrodes are arranged on the surfaces of the vibrating reed 10. Among these, the electrodes other than the adjustment electrode are formed by depositing a Cr layer and an Au layer in this order by sputtering or the like and subjecting the layers to photolithography and etching processes, conforming to the shapes of the various electrodes. On the other hand, the adjustment electrode is formed by covering the vibrating reed 10 with a mask having an opening only at a forming region of the adjustment electrode on the vibrating reed 10 and forming an Au layer at the forming location by vacuum vapor deposition.

Although the vibrating reed 10 is obtained by forming its external shape by etching and then forming the electrodes by the method described above, it is necessary to perform adjustments of characteristics of the vibrating reed 10, such as a resonant frequency. In this case, a portion of the adjustment electrode is cut off by a laser or the like to thereby adjust the weight of the vibrating arm 16 on the tip portion 18 side and the weight of the detection arm 20 on the tip portion 22 side, so that the adjustment of the characteristic is performed.

However, since variations occur in the positioning of the forming location of the adjustment electrode using the mask, even when the adjustment electrode is cut off as described above, it is difficult to suppress variations in the characteristics of the vibrating reed 10. Therefore, in the embodiment, the adjustment electrode is formed by vacuum vapor deposition, and thereafter, the external shape thereof is made up by subjecting the adjustment electrode to photolithography and etching processes, whereby variations in the shape and position of the adjustment electrode are reduced. Hereinafter, manufacturing steps of the adjustment electrode will be described.

Figure 7A:
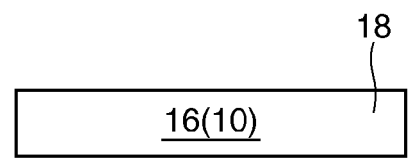
FIGS. 7A to 7G show manufacturing steps (Part 1) of an electrode formed on the vibrating reed of the embodiment.

As shown in FIG. 7A, the external shape of the vibrating reed 10 is formed by etching. Here, FIGS. 7A to 9D are assumed to be cross-sectional views of the vibrating arm 16 (or the detection arm 20) as a portion of the vibrating reed 10. Moreover, the right portion of the vibrating arm is the tip portion 18 (or the tip portion 22), at which a forming region of an adjustment electrode 42 (FIG. 8D) is disposed. The left portion is the other portion of the vibrating arm 16 than the tip portion 18, at which a forming region of an excitation electrode 46 (FIG. 8C) (or a forming region of the detection electrode) is disposed.

Figure 7B:
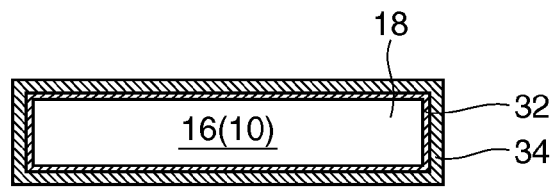
Figure 7C:
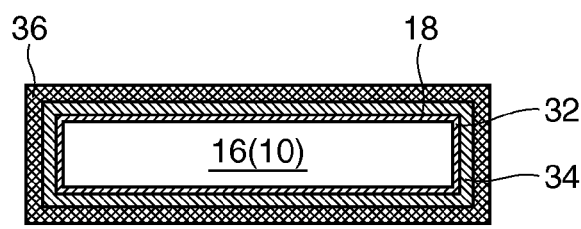
Figure 7D:
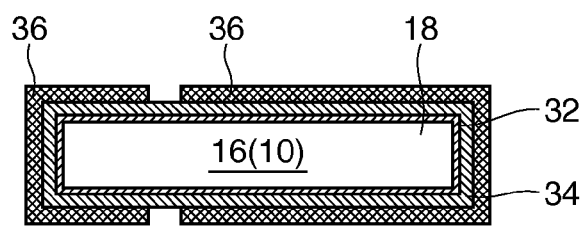

As shown in FIG. 7B, on the surface of the vibrating arm 16 (the vibrating reed 10), a Cr layer 32 and an Au layer 34 are formed in this order by sputtering. As shown in FIG. 7C, a resist film 36 is applied thereon. As shown in FIG. 7D, a portion of the resist film 36 other than an electrode pattern of the vibrating reed 10 is exposed, and the exposed portion is removed. In this case, although the tip portion 18 is covered with the resist film 36, the resist film 36 is patterned so as to encompass the forming region of the adjustment electrode 42 (FIG. 8D).

Figure 7E:
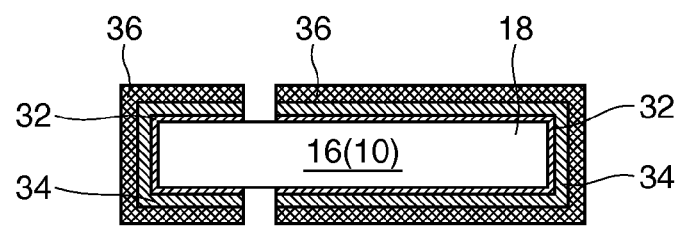
Figure 7F:
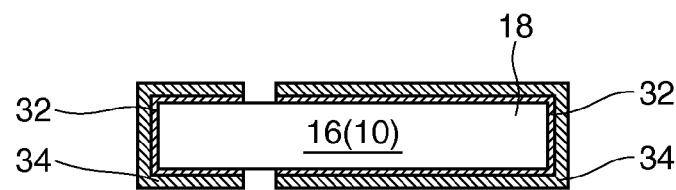
Figure 7G:
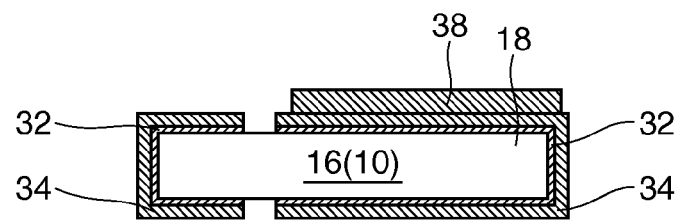

As shown in FIG. 7E, portions of the Cr layer 32 and the Au layer 34 exposed from the resist film 36 are removed by etching. As shown in FIG. 7F, the remaining resist film 36 is removed. As shown in FIG. 7G, the vibrating reed 10 is covered with a mask (not shown) having an opening at a region encompassing the forming region of the adjustment electrode 42, and an Au layer 38 is formed by vacuum vapor deposition.

Figure 8A:
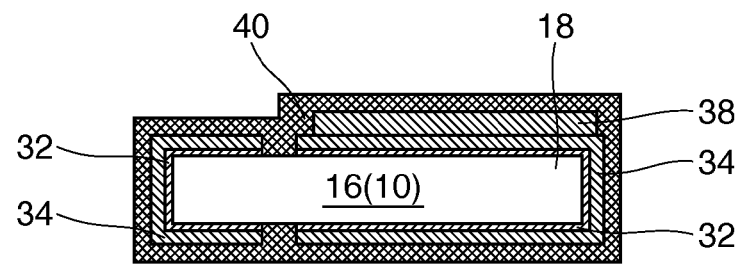
FIGS. 8A to 8D show manufacturing steps (Part 2) of the electrode formed on the vibrating reed of the embodiment.
Figure 8B:
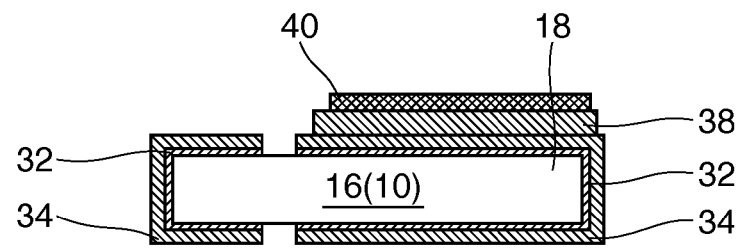
Figure 8C:
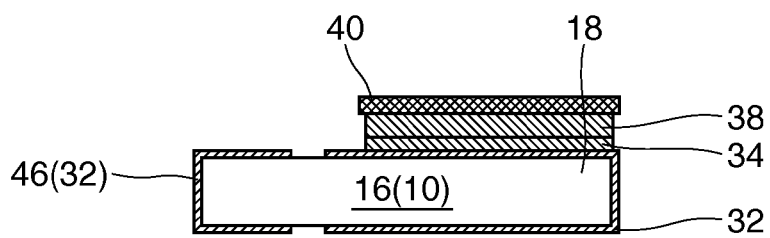

As shown in FIG. 8A, the vibrating arm 16 (the vibrating reed 10) with the metal films formed on the vibrating arm 16 (the vibrating reed 10) is covered with a resist film 40. As shown in FIG. 8B, a portion of the resist film 40 other than a portion overlapping with the forming region of the adjustment electrode 42 is exposed, and the exposed portion is removed. As shown in FIG. 8C, portions of the Au layer 34 and the Au layer 38 exposed from the resist film 40 are etched using an etchant such as KI or $I_2$ while leaving the Cr layer 32.

Figure 8D:
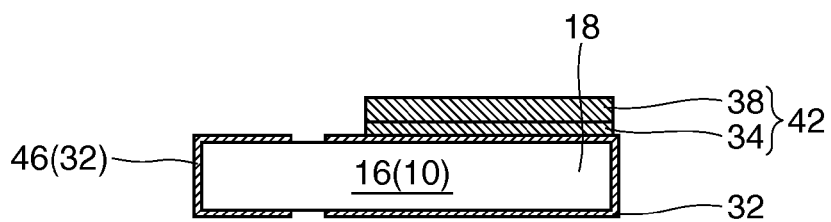

As shown in FIG. 8D, the resist film 40 is removed, so that the adjustment electrode 42 is patterned. The adjustment electrode 42 has a stacked structure of the Au layer 34 and the Au layer 38. Since the adjustment electrode 42 is formed in this manner, the positioning of the adjustment electrode can be performed with the positional accuracy of a photolithography process. Therefore, variations in the manufacture of the adjustment electrode 42 can be reduced, so that variations in the characteristics of the vibrating reed 10 can be suppressed.

By the way, the thickness of the Au layer 34 formed by sputtering is on the order of 10 nm, while the thickness of the Au layer 38 formed by vacuum vapor deposition is on the order of 1 µm. Therefore, when the adjustment electrode 42 is only formed of the stacked structure of the Au layer 34 and the Au layer 38, a fine adjustment of a resonant frequency or the like is sometimes difficult. Therefore, it is preferred as shown in FIGS. 9A to 9D that the stacked structure of the Au layer 34 and the Au layer 38 is patterned on one of the surfaces of the tip portion 18 to form the adjustment electrode 42 and the Au layer 34 formed by sputtering is patterned on the opposite surface to form an adjustment electrode 44.

Figure 9A:
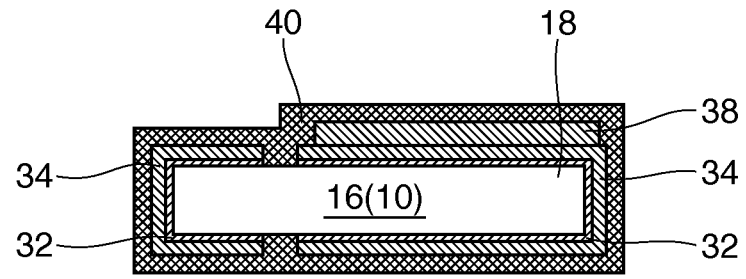
FIGS. 9A to 9D show manufacturing steps (Part 3) of the electrode formed on the vibrating reed of the embodiment.
Figure 9B:
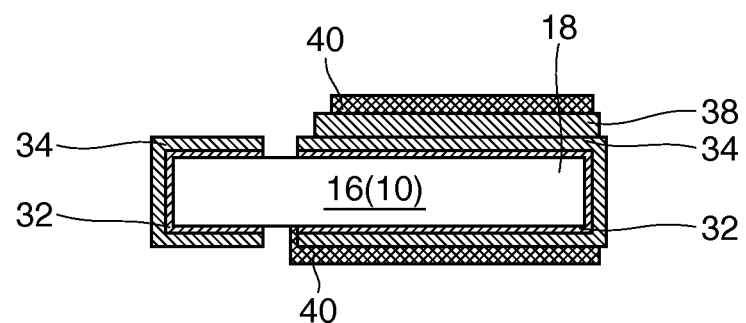

After the manufacture of the vibrating reed of the embodiment is performed to the step shown in FIG. 7G, the vibrating arm 16 (the vibrating reed 10) with the metal films formed on the vibrating arm 16 (the vibrating reed 10) is covered with the resist film 40 as shown in FIG. 9A. As shown in FIG. 9B, for a portion of the resist film 40 covering one of the surfaces of the tip portion 18, a portion of the resist film 40 other than a portion overlapping with the forming region of the adjustment electrode 42 located inside a region where the Au layer 38 formed by vacuum vapor deposition is arranged is exposed. For a portion of the resist film 40 covering the opposite surface of the tip portion 18, a portion of the resist film 40 other than a portion overlapping with a forming region of the adjustment electrode 44 located inside a region where the Au layer 34 formed by sputtering is arranged is exposed. The exposed portions are removed.

Figure 9C:
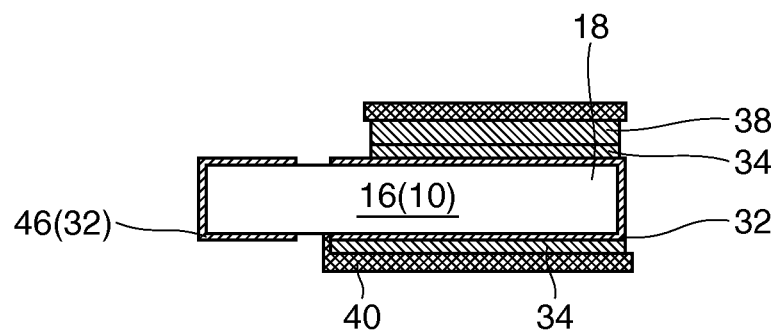
Figure 9D:
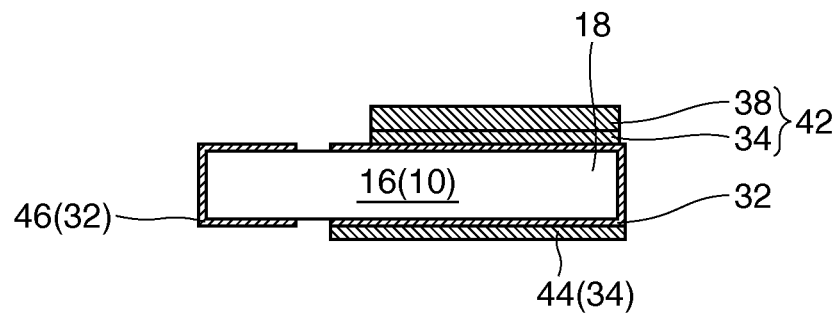

As shown in FIG. 9C, portions of the Au layers 34 and 38 exposed from the resist film 40 are etched using an etchant such as KI or $I_2$ while leaving the Cr layer 32. As shown in FIG. 9D, the resist film 40 is removed, so that the adjustment electrode 42 formed of the stacked structure of the Au layer 34 and the Au layer 38 is patterned on the one surface of the tip portion 18, while the adjustment electrode 44 formed of the Au layer 34 is patterned on the opposite surface.

The positioning of any of the adjustment electrodes 42 and 44 can be performed with the positional accuracy of a photolithography process similarly to the above. In this case, a coarse adjustment of the resonant frequency can be performed by removing a portion of the adjustment electrode 42 with a laser, and a fine adjustment of the resonant frequency can be performed by removing a portion of the adjustment electrode 44 with a laser.

Figure 10:
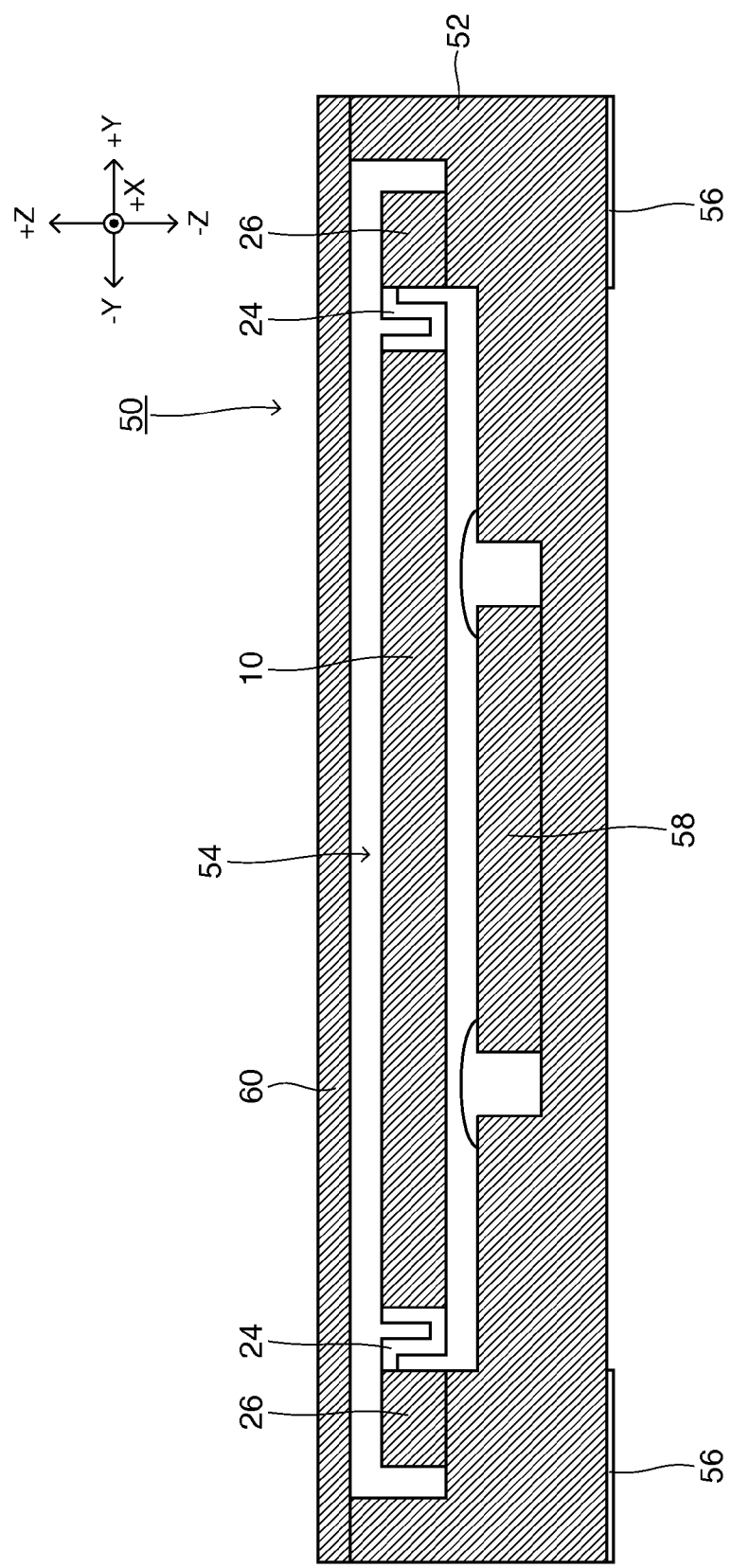
FIG. 10 is a cross-sectional view of an electronic device on which the vibrating reed of the embodiment is mounted.

FIG. 10 shows a cross-sectional view of an electronic device on which the vibrating reed of the embodiment is mounted. The electronic device 50 of the embodiment is obtained by accommodating the vibrating reed 10 and an integrated circuit 58 in a recess 54 of a package 52 and covering an opening of the recess 54 with a lid 60 to vacuum-seal the vibrating reed 10. In the cross-sectional view of the electronic device 50 shown in FIG. 10, a cross-sectional view of the vibrating reed 10 is a cross-sectional view taken along line A-A of FIG. 1.

The vibrating reed 10 is accommodated in the recess 54 of the package 52 in a state where the vibrating reed 10 is spaced apart from the lid 60. Moreover, the support portion 26 is bonded to the package 52, while the other portions are arranged in a state of being spaced apart from a bottom surface of the package 52 and the integrated circuit 58. The integrated circuit 58 is electrically connected to the connection electrode electrically connected to the excitation electrodes and the connection electrode electrically connected to the detection electrodes, the connection electrodes being arranged on the support portion 26. Moreover, mount electrodes 56 are arranged on a lower surface of the package 52. The mount electrodes 56 are electrically connected to the integrated circuit 58 and the lid 60. The mount electrodes 56 are those for supplying electric power to the integrated circuit 58, applying a voltage for adjusting an oscillating frequency of an oscillation signal generated from the integrated circuit 58, outputting a detection signal of an angular velocity amplified by the integrated circuit 58, grounding the lid 60, or the like.

Figure 11:
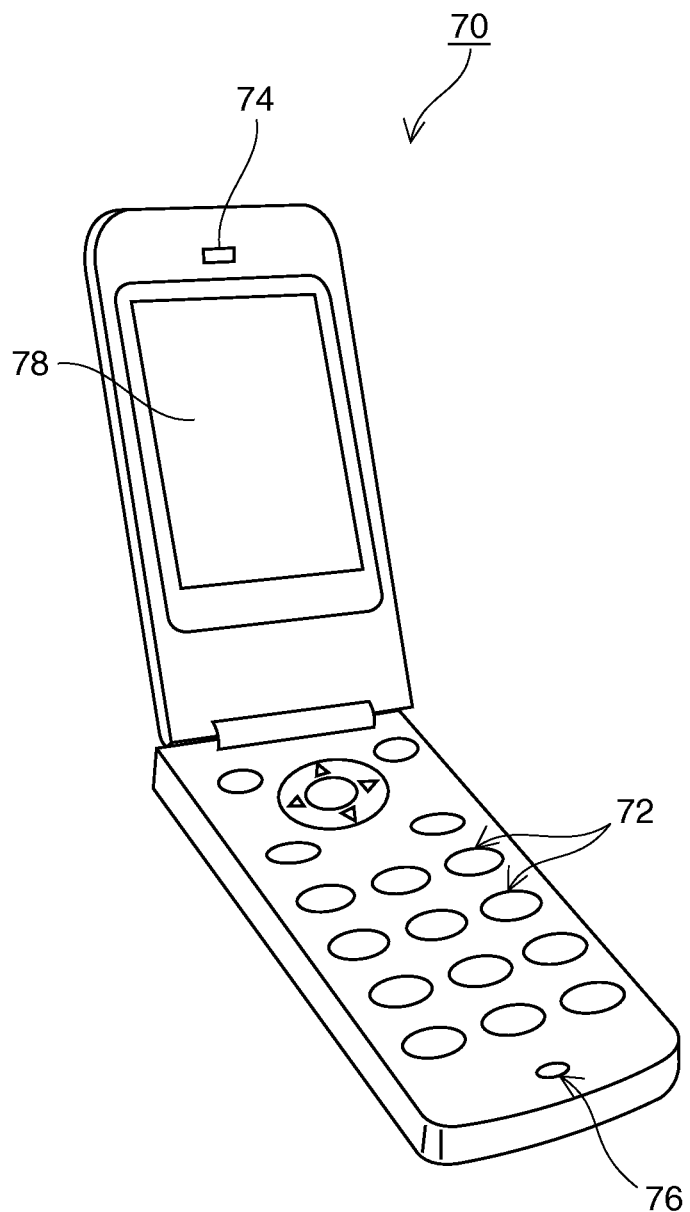
FIG. 11 is a schematic view of an electronic apparatus on which the vibrating reed of the embodiment is mounted.

FIG. 11 shows a schematic view of an electronic apparatus (portable terminal) on which the electronic component of the embodiment is mounted. In FIG. 11, the portable terminal 70 (including a PHS) includes a plurality of operation buttons 72, an earpiece 74, and a mouthpiece 76. Between the operation buttons 72 and the earpiece 74, a display portion 78 is arranged. Recently, a camera with an image stabilizing function is included also in the portable terminal 70. Therefore, in the portable terminal 70, the vibrating reed 10 or the electronic device 50 of the embodiment is incorporated for angular velocity detection used for the image stabilizing function.

In addition to the portable terminal 70 described above, an electronic apparatus including the vibrating reed of the embodiment can be applied to high-performance portable terminals, digital still cameras, personal computers, laptop personal computers, television sets, video camcorders, videotape recorders, car navigation systems, pagers, inkjet ejection apparatuses, electronic notebooks, calculators, electronic gaming machines, word processors, workstations, videophones, surveillance TV monitors, electronic binoculars, POS terminals, medical equipment (for example, electronic thermometers, sphygmomanometers, blood glucose meters, electrocardiogram measuring systems, ultrasonic diagnosis apparatuses, and electronic endoscopes), fishfinders, various kinds of measuring instruments, indicators (for example, indicators used in vehicles, aircraft, and ships), flight simulators, and the like.

The entire disclosure of Japanese Patent Application No. 2012-126757, filed Jun. 4, 2012 is expressly incorporated by reference herein.

What is claimed is:

1. A vibrating reed comprising:
   a vibrating body; and
   a support portion that supports the vibrating body via a coupling portion, wherein
   a groove is disposed in both principal surfaces of the coupling portion, and
   the groove arranged in one of the principal surfaces of the coupling portion and the groove arranged in the other principal surface are arranged at positions different from each other in plan view.

2. The vibrating reed according to claim 1, wherein the sum of the depth of the groove arranged in the one principal surface of the coupling portion and the depth of the groove arranged in the other principal surface has a value greater than that of the thickness of the coupling portion.

3. An electronic device comprising the vibrating reed according to claim 2 mounted thereon.

4. An electronic apparatus comprising the vibrating reed according to claim 2 mounted thereon.

5. The vibrating reed according to claim 1, wherein
the coupling portion bends in a direction perpendicular to a thickness direction of the coupling portion.

6. An electronic device comprising the vibrating reed according to claim 5 mounted thereon.

7. An electronic apparatus comprising the vibrating reed according to claim 5 mounted thereon.

8. The vibrating reed according to claim 1, wherein
a plurality of the grooves are arranged side by side along a vibration propagation path on the coupling portion from the vibrating body to the support portion.

9. An electronic device comprising the vibrating reed according to claim 8 mounted thereon.

10. An electronic apparatus comprising the vibrating reed according to claim 8 mounted thereon.

11. The vibrating reed according to claim 1, wherein
when directions perpendicular to each other are defined as a first direction and a second direction, the vibrating body includes a base portion connected to the coupling portion, a pair of coupling arms extending from the base portion in opposite directions in the first direction, a pair of vibrating arms extending from a tip of each of the coupling arms in opposite directions in the second direction, and a pair of detection arms extending from the base portion in opposite directions in the second direction.

12. An electronic device comprising the vibrating reed according to claim 11 mounted thereon.

13. An electronic apparatus comprising the vibrating reed according to claim 11 mounted thereon.

14. An electronic device comprising the vibrating reed according to claim 1 mounted thereon.

15. An electronic apparatus comprising the vibrating reed according to claim 1 mounted thereon.

* * * * *